(12) United States Patent
Wei et al.

(10) Patent No.: US 6,901,083 B2
(45) Date of Patent: May 31, 2005

(54) METHOD AND SYSTEM FOR CODE COMBINING AT AN OUTER DECODER ON A COMMUNICATION SYSTEM

(75) Inventors: Yongbin Wei, San Diego, CA (US); Tao Chen, San Diego, CA (US); Edward G. Tiedemann, Jr., Concord, MA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 10/600,890

(22) Filed: Jun. 20, 2003

(65) Prior Publication Data

US 2004/0090932 A1 May 13, 2004

Related U.S. Application Data

(60) Provisional application No. 60/421,244, filed on Oct. 25, 2002.

(51) Int. Cl.[7] ............................................ H04J 3/04
(52) U.S. Cl. ..................... 370/536; 370/543; 341/61; 714/792
(58) Field of Search ............................... 370/232–234, 370/252, 265, 352, 441, 466, 474, 477, 480, 482, 532, 535, 536, 540, 542, 544; 341/61, 106, 141; 375/265, 341, 262; 714/755–756, 784, 786, 790, 792

(56) References Cited

U.S. PATENT DOCUMENTS

| | | | |
|---|---|---|---|
| 4,901,307 A | | 2/1990 | Gilhousen et al. |
| 4,941,154 A | * | 7/1990 | Wei .............................. 714/792 |
| 5,103,459 A | | 4/1992 | Gilhousen et al. |
| 5,321,725 A | * | 6/1994 | Paik et al. .................... 375/265 |
| 5,400,024 A | * | 3/1995 | Nishimura et al. ............ 341/61 |
| 5,416,804 A | * | 5/1995 | Khaled et al. ............... 375/341 |
| 5,504,773 A | | 4/1996 | Padovani et al. |
| 5,751,725 A | | 5/1998 | Chen |
| 5,774,496 A | | 6/1998 | Butler et al. |
| 5,983,382 A | * | 11/1999 | Pauls .......................... 370/352 |
| 6,202,189 B1 | * | 3/2001 | Hinedi et al. ................ 714/790 |
| 6,574,211 B2 | | 6/2003 | Padovani et al. |
| 2002/0147954 A1 | * | 10/2002 | Shea ........................... 714/755 |

FOREIGN PATENT DOCUMENTS

| | | |
|---|---|---|
| EP | 1119110 | 7/2001 |
| WO | 0217615 | 2/2002 |

OTHER PUBLICATIONS

Agashe, P. "CDMA2000 High Rate Multicast Packet Data Air Interface Specification," *3GPP2 TSG–C CDMA2000 Meeting*, Jun. 10–14, 2002, XP002273380, pp. 1–48.

Agashe, P. "CDMA200 High Rate Broadcast Packet Data Air Interface Stimulation Results", *3GPP2 TSG–C Meeting*, Jul. 8–12, 2000, XP002273381, pp. 1–9.

3GPP2: "CDMA2000 High Rate Packet Data Air Interface Specification", *3GPP2 3rd Generation Partnership Project 2* , Dec. 5, 2001, XP002273729, pp. 9–68–9–89.

* cited by examiner

*Primary Examiner*—Duc Ho
*Assistant Examiner*—Phuongchau Ba Nguyen
(74) *Attorney, Agent, or Firm*—Philip R. Wadsworth; Thien T. Nguyen; S. Hossain Beladi

(57) ABSTRACT

An outer encoder and an inner encoder encode subsets of information to be transmitted, to improve protection by adding redundancy. The redundancy permits decoding of the information from less than a complete encoded block of information. The use of a combiner at an outer decoder enables better outer decoding of symbols.

14 Claims, 6 Drawing Sheets

METHOD AND SYSTEM FOR CODE COMBINING AT AN OUTER DECODER ON A COMMUNICATION SYSTEM

This application is a non-provisional application claiming priority to provisional application Ser. No. 60/421,244, filed on Oct. 25, 2002, entitled "Method and System For Code Combining at an Outer Decoder on a Communication System".

BACKGROUND

1. Field

The present invention relates to broadcast communications, otherwise known as point-to-multipoint communications, in a wireline or a wireless communication system. More particularly, the present invention relates to a system and method for code combining at an outer decoder in such a broadcast communication system.

2. Background

Communication systems have been developed to allow transmission of information signals from an origination station to a physically distinct destination station. In transmitting the information signal from the origination station over a communication channel, the information signal is first converted into a form suitable for efficient transmission over the communication channel. Conversion, or modulation, of the information signal involves varying a parameter of a carrier wave in accordance with the information signal in such a way that the spectrum of the resulting modulated carrier is confined within the communication channel bandwidth. At the destination station the original information signal is replicated from the modulated carrier wave received over the communication channel. Such a replication is generally achieved by using an inverse of the modulation process employed by the origination station.

Modulation also facilitates multiple-access, i.e., simultaneous transmission and/or reception, of several signals over a common communication channel. Multiple-access communication systems often include a plurality of subscriber stations requiring intermittent service of relatively short duration rather than continuous access to the common communication channel. Several multiple-access techniques are known in the art, such as time division multiple-access (TDMA), frequency division multiple-access (FDMA), and amplitude modulation multiple-access (AM). Another type of a multiple-access technique is a code division multiple-access (CDMA) spread spectrum system that conforms to the "TIA/EIA/IS-95 Mobile Station-Base Station Compatibility Standard for Dual-Mode Wide-Band Spread Spectrum Cellular System," hereinafter referred to as the IS-95 standard. The use of CDMA techniques in a multiple-access communication system is disclosed in U.S. Pat. No. 4,901,307, entitled "SPREAD SPECTRUM MULTIPLE-ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM," both assigned to the assignee of the present invention.

A multiple-access communication system may be a wireless or wire-line and may carry voice and/or data. An example of a communication system carrying both voice and data is a system in accordance with the IS-95 standard, which specifies transmitting voice and data over the communication channel. A method for transmitting data in code channel frames of fixed size is described in detail in U.S. Pat. No. 5,504,773, entitled "METHOD AND APPARATUS FOR THE FORMATTING OF DATA FOR TRANSMISSION", assigned to the assignee of the present invention. In accordance with the IS-95 standard, the data or voice is partitioned into code channel frames that are 20 milliseconds wide with data rates as high as 14.4 Kbps. Additional examples of communication systems carrying both voice and data comprise communication systems conforming to the "3rd Generation Partnership Project" (3GPP), embodied in a set of documents including Document Nos. 3G TS 25.211, 3G TS 25.212, 3G TS 25.213, and 3 G TS 25.214 (the W-CDMA standard), or "TR-45.5 Physical Layer Standard for cdma2000 Spread Spectrum Systems, Release C" (the IS-2000 standard), also known as the 1×EV-DV proposal.

An example of a data only communication system is a high data rate (HDR) communication system that conforms to the TIA/EIA/IS-856 industry standard, hereinafter referred to as the IS-856 standard. This HDR system is based on a communication system disclosed in U.S. Pat. No. 6,574,211, entitled "METHOD AND APPARATUS FOR HIGH RATE PACKET DATA TRANSMISSION," issued Jun. 3, 2003, and assigned to the assignee of the present invention. The HDR communication system defines a set of data rates, ranging from 38.4 kbps to 2.4 Mbps, at which an access point (AP) may send data to a subscriber station (access terminal, AT). Because the AP is analogous to a base station, the terminology with respect to cells and sectors is the same as with respect to voice systems.

In a multiple-access communication system, communications among users are conducted through one or more base stations. A first user on one subscriber station communicates to a second user on a second subscriber station by transmitting data on a reverse link to a base station. The base station receives the data and can route the data to another base station. The data is transmitted on a forward link of the same base station, or the other base station, to the second subscriber station. The forward link refers to transmission from a base station to a subscriber station and the reverse link refers to transmission from a subscriber station to a base station. Likewise, the communication can be conducted between a first user on one subscriber station and a second user on a landline station. A base station receives the data from the user on a reverse link, and routes the data through a public switched telephone network (PSTN) to the second user. In many communication systems, e.g., IS-95, W-CDMA, IS-2000, the forward link and the reverse link are allocated separate frequencies.

The above described wireless communication service is an example of a point-to-point communication service. In contrast, broadcast services provide point-to-multipoint communication service. The basic model of a broadcast system consists of a broadcast net of users served by one or more central stations, which transmit information with a certain contents, e.g., news, movies, sports events and the like to the users. Each broadcast net user's subscriber station monitors a common broadcast forward link signal. Because the central station fixedly determines the content, the users are generally not communicating back. Examples of common usage of broadcast services communication systems are TV broadcast, radio broadcast, and the like. Such communication systems are generally highly specialized purpose-build communication systems. With the recent, advancements in wireless cellular telephone systems there has been an interest of utilizing the existing infrastructure of the—mainly point-to-point cellular telephone systems for broadcast services. (As used herein, the term "cellular" systems encompasses communication systems utilizing both cellular and PCS frequencies.)

The information signal to be exchanged among the terminals in a communication system is often organized into a plurality of packets. For the purposes of this description, a packet is a group of bytes, including data (payload) and control elements, arranged into a specific format. The control elements comprise, e.g., a preamble and a quality metric. The quality metric comprises, e.g., cyclical redundancy check (CRC), parity bit(s), and other types of metric known to one skilled in the art. The packets are usually formatted into a message in accordance with a communication channel structure. The message, appropriately modulated, traveling between the origination terminal and the destination terminal, is affected by characteristics of the communication channel, e.g., signal-to-noise ratio, fading, time variance, and other such characteristics. Such characteristics affect the modulated signal differently in different communication channels. Consequently, transmission of a modulated signal over a wireless communication channel requires different considerations than transmission of a modulated signal over a wire-like communication channel, e.g., a coaxial cable or an optical cable.

In addition to selecting a modulation appropriate for a particular communication channel, other methods for protecting the information signal have been devised. Such methods comprise, e.g., encoding, symbol repetition, interleaving, and other methods know to one of ordinary skill in the art. However, these methods increase overhead. Therefore, an engineering compromise between reliability of message delivery and the amount of overhead must be made. Even with the above-discussed protection of information, the conditions of the communication channel can degrade to the point at which the destination station possibly cannot decode (erases) some of the packets comprising the message. In data-only communications systems, the cure is to re-transmit the non-decoded packets using an Automatic Retransmission reQuest (ARQ) made by the destination station to the origination station. However, as discussed, the subscribers do not communicate back to the base station. Furthermore, even if the subscribers were allowed to communicate ARQ, this communication might overload the communication system. Consequently, other means of information protection are desirable.

An outer code and an inner code are utilized in communication systems to provide information protection. An outer code comprises an outer encoder at a base station controller and an outer decoder at a subscriber station. An inner code comprises an inner encoder at a base station and an inner decoder at a subscriber station. The outer code and inner code involve encoding and decoding a block of information. The outer and inner code adds redundant information to improve protection. The redundancy permits decoding of the information from less than a complete encoded block of information.

A bit stream of information to be transmitted is provided to transmit buffers and encoded by an outer decoder communicatively coupled to the transmit buffers. Redundant bits are provided to each transmit buffer. Then, the content of the transmit buffers is multiplexed and encoded by an inner encoder to improve information protection further. The receiving subscriber station recovers the transmitted information by an inverse process, i.e., decoding.

Co-pending application Ser. No. 09/933,912, entitled "METHOD AND SYSTEM FOR UTILIZATION OF AN OUTER DECODER IN A BROADCAST SERVICES COMMUNICATION SYSTEM," filed Aug. 20, 2001, and assigned to the assignee of the present invention, discussed in detail utilization of an outer decoder in a broadcast system. Co-pending application Ser. No. 10/226/058, entitled "METHOD AND SYSTEM FOR COMMUNICATING CONTENT ON A BROADCAST SERVICES COMMUNICATION SYSTEM," filed Aug. 21, 2002, and assigned to the assignee of the present invention, also discussed in detail utilization of an outer decoder in a broadcast system and focused on time re-alignment of two transmissions of the same content from two base stations to mitigate the problem of clipped frames.

Co-pending application Ser. No. 09/976,591, entitled "METHOD AND SYSTEM FOR REDUCTION OF DECODING COMPLEXITY IN A COMMUNICATION SYSTEM," filed Oct. 12, 2001, and assigned to the assignee of the present invention, discussed in detail the transmit buffers of the outer code in a broadcast system.

Even with an outer code and inner code, a subscriber station may not be able to create the bit stream of information from decoded received packets from a particular base station. Thus, there is a need in the art for a method and a system that enables creating the bit stream of information even when a subscriber station cannot create the bit stream of information from decoded packets received from a particular base station.

SUMMARY

Embodiments disclosed herein address the above stated needs by providing a method and system for code combining at an outer decoder on a communication system.

DETAILED DESCRIPTION

Definitions

Figure 1:
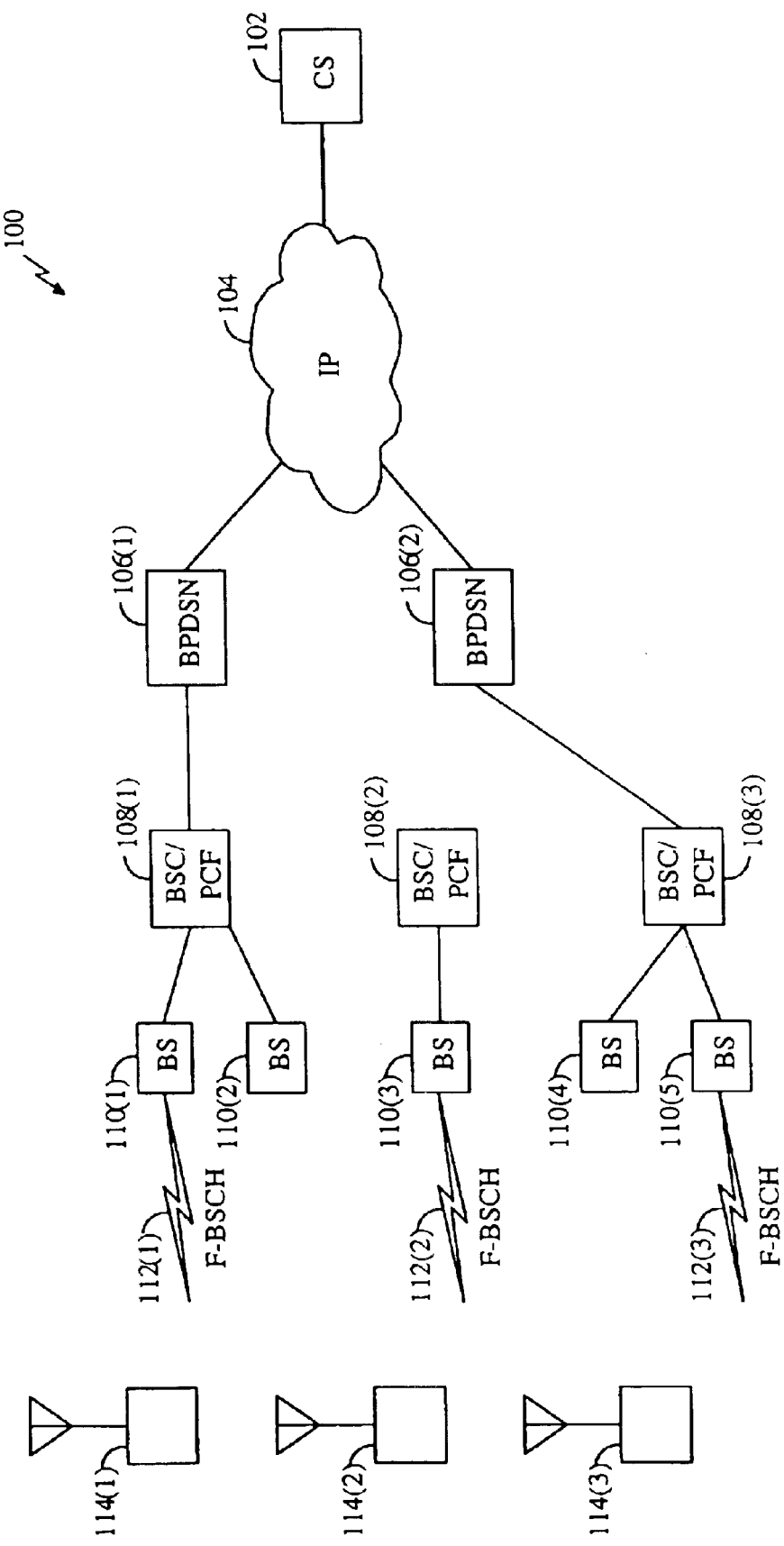
FIG. 1 illustrates conceptual block diagram of a High-Speed Broadcast Service (HSBS) communication system.

The word "exemplary" is used herein to mean "serving as an example, instance, or illustration." Any embodiment described herein as "exemplary" is not necessarily to be construed as preferred or advantageous over other embodiments.

The terms point-to-point communication is used herein to mean a communication between two subscriber stations over a dedicated communication channel.

The terms broadcast communication or point-to-multipoint communication are used herein to mean a communication wherein a plurality of subscriber stations are receiving communication from one source.

The term packet is used herein to mean a group of bits, including data (payload) and control elements, arranged into a specific format. The control elements comprise, e.g., a preamble, a quality metric, and others known to one skilled in the art. Quality metric comprises, e.g., a cyclical redundancy check (CRC), a parity bit, and others known to one skilled in the art.

The term access network is used herein to mean a collection of base stations (BS) and one or more base stations' controllers. The access network transports data packets between multiple subscriber stations. The access network may be further connected to additional networks outside the access network, such as a corporate intranet or the Internet, and may transport data packets between each access terminal and such outside networks.

The term base station is used herein to mean the hardware with which subscriber stations communicate. Cell refers to the hardware or a geographic coverage area, depending on the context in which the term is used. A sector is a partition of a cell. Because a sector has the attributes of a cell, the teachings described in terms of cells are readily extended to sectors.

The term subscriber station is used herein to mean the hardware with which an access network communicates. A subscriber station may be mobile or stationary. A subscriber station may be any data device that communicates through a wireless channel or through a wired channel, for example using fiber optic or coaxial cables. A subscriber station may further be any of a number of types of devices including but not limited to PC card, compact flash, external or internal modem, or wireless or wireline phone. A subscriber station that is in the process of establishing an active traffic channel connection with a base station is said to be in a connection setup state. A subscriber station that has established an active traffic channel connection with a base station is called an active subscriber station, and is said to be in a traffic state.

The term physical channel is used herein to mean a communication route over which a signal propagates described in terms of modulation characteristics and coding.

The term logical channel is used herein to mean a communication route within the protocol layers of either the base station or the subscriber station.

The term communication channel/link is used herein to mean a physical channel or a logical channel in accordance with the context.

The term reverse channel/link is used herein to mean a communication channel/link through which the subscriber station sends signals to the base station.

A forward channel/link is used herein to mean a communication channel/link through which a base station sends signals to a subscriber station.

The term soft handoff is used herein to mean a communication between a subscriber station and two or more sectors, wherein each sector belongs to a different cell. The reverse link communication is received by both sectors, and the forward link communication is simultaneously carried on the two or more sectors' forward links.

The term softer handoff is used herein to mean a communication between a subscriber station and two or more sectors, wherein each sector belongs to the same cell. The reverse link communication is received by both sectors, and the forward link communication is simultaneously carried on one of the two or more sectors' forward links.

The term erasure is used herein to mean failure to recognize a message.

The term dedicated channel is used herein to mean a channel modulated by information specific to an individual subscriber station.

The term common channel is used herein to mean a channel modulated by information shared among all subscriber stations.

Description

A basic model of a broadcast system comprises a broadcast net of users, served by one or more central stations, which transmit information with a certain contents, e.g., news, movies, sports events and the like to the users. Each broadcast net user's subscriber station monitors a common broadcast forward link signal. FIG. 1 illustrates a conceptual block diagram of a communication system 100, capable of performing High-Speed Broadcast Service (HSBS) in accordance with an embodiment.

The broadcast content originates at a content server (CS) 102. The content server may be located within the carrier network (not shown) or outside Internet (IP) 104. The content is delivered in a form of packets to a broadcast packet data-serving node (BPDSN) 106. The term BPDSN is used because although the BPDSN may be physically co-located, or be identical to a regular PDSN (not shown), the BPDSN may be logically different from a regular PDSN. The BPDSN 106 delivers the packets according to the packet's destination to a packet control function (PCF) 108. The PCF is a control entity controlling function of base stations 110 for the HSBS as a base station controller is for regular voice and data services. To illustrate the connection of the high level concept of the HSBS with the physical access network, FIG. 1 shows a PCF physically co-located or even identical, but logically different from a base station controller (BSC). The BSC/PCF 108 provides the packets to base stations 114.

Figure 2:
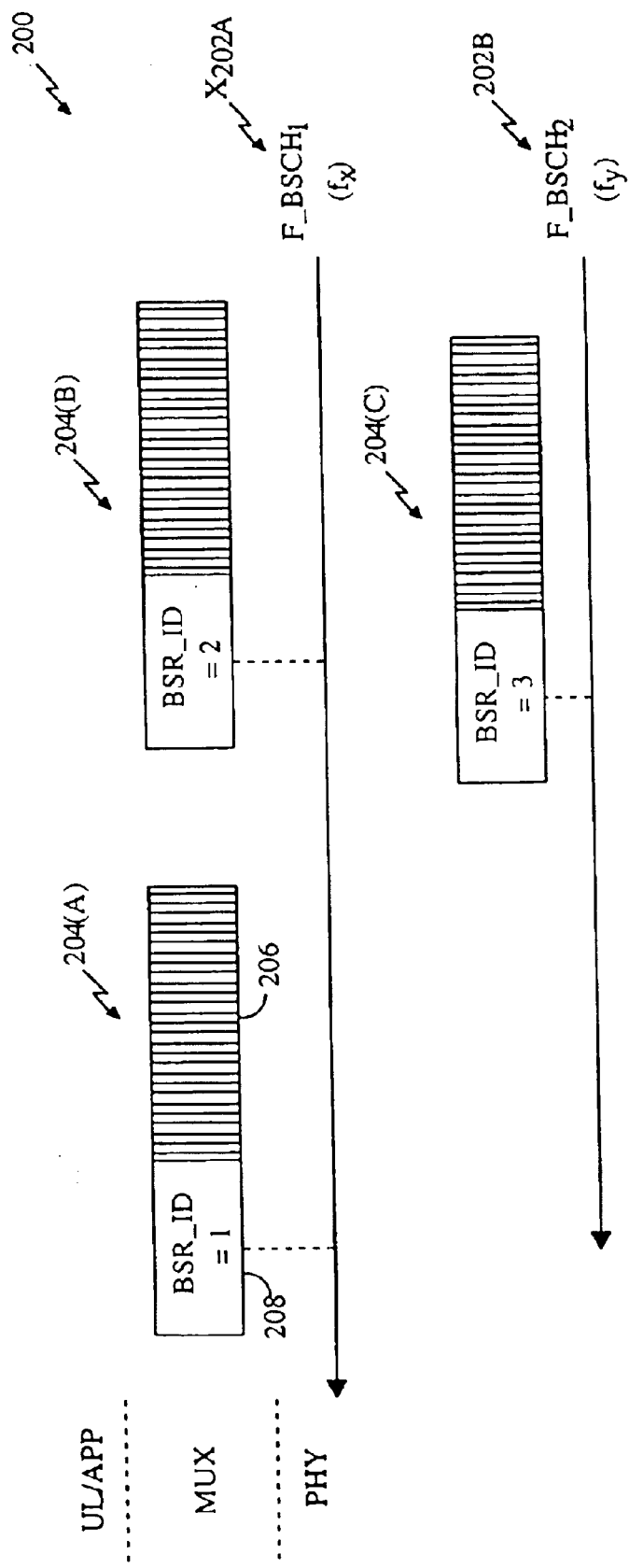
FIG. 2 illustrates a concept of physical and logical channels for the HSBS.

The communication system 100 enables High-Speed Broadcast Service (HSBS) by introducing a forward broadcast shared channel (F-BSCH) 112 capable of high data rates that can be received by a large number of subscriber stations 114. The term forward broadcast shared channel is used herein to mean a single forward link physical channel that carries broadcast traffic. A single F-BSCH can carry one or more HSBS channels multiplexed in a TDM fashion within the single F-BSCH. The term HSBS channel is used herein to mean a single logical HSBS broadcast session defined by the session's broadcast content. Each session is defined by a broadcast content that may change with time; for example, 7am—News, 8am—Weather, 9am—Movies, etc. FIG. 2 illustrates the discussed concept of physical and logical channels for the HSBS in accordance with an embodiment.

As illustrated in FIG. 2, an HSBS is provided on two F-BSCHs 202, each of which is transmitted on a separate frequency fx, fy. Thus, for example, in the above-mentioned cdma2000 communication system such a physical channel can comprise, e.g., a forward supplemental channel (F-SCH), forward broadcast control channel (F-BCCH), forward common control channel (F-CCCH), other common and dedicated channels and the channel's combination. The use of common and dedicated channels for information broadcast is disclosed in a co-pending U.S. patent application Ser. No. 10/113,09, entitled "METHOD AND APPARATUS FOR CHANNEL MANAGEMENT FOR POINT-TO-MULTIPOINT SERVICES IN A COMMUNICATION SYSTEM", filed Mar. 28, 2002, and assigned to the assignee of the present invention. One of ordinary skill in the art understands that other communication systems utilize channels performing similar function; therefore, the teaching is applicable to other communication systems.

The F-BSCHs 202 carry the broadcast traffic, which may comprise one or more broadcast sessions. The F-BSCH1 carries two HSBS channels 204a, 204b, which are multiplexed onto the F-BSCH1 202a. The F-BSCH2 202b carries one HSBS channel 204c. The content of an HSBS channel is formatted into packets comprising a payload 206 and a header 208.

One of ordinary skill in the art recognizes that the HSBS broadcast service deployment as illustrated in FIG. 2 is for pedagogical purposes only. Therefore, in a given sector, the HSBS broadcast service can be deployed in several manners in accordance with features supported by an implementation of a particular communication system. The implementation features include, e.g., the number of HSBS sessions supported, number of frequency assignments, number of broadcast physical channels supported, and other implementation features known to one skilled in the art. Thus, for example, more than two frequencies, and F-BSCHs may be deployed in a sector. Furthermore, more than two HSBS channels may be multiplexed onto one F-BSCH. Furthermore, a single HSBS channel can be multiplexed onto more than one broadcast channel within a sector, on different frequencies to serve the subscribers residing in those frequencies.

Figure 3:
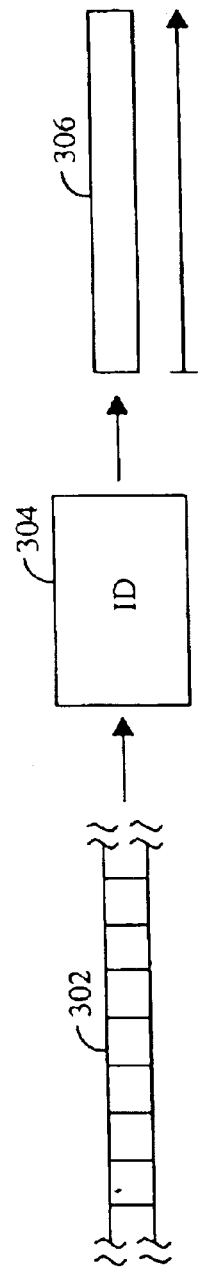
FIG. 3 illustrates a prior art inner encoding in accordance with an embodiment.

As discussed, communications systems often transmit information in frames or blocks, which are protected by encoding against adverse condition affecting a communication channel. Examples of such systems comprise cdma2000, WCDMA, UMTS. As illustrated in FIG. 3, the bit stream of information to be transmitted 302, originating at higher layers, is provided to an (inner) encoder 304 on a physical layer. The encoder accepts a block of bits of a length S. This block of S bits typically includes some overhead, e.g., tail bits for the inner encoder, a cyclic redundancy check (CRC), and other overhead information known to one of ordinary skills in the art. The overhead bits assist the inner decoder at the receiving side ascertain success or failure of decoding. The encoder then encodes the S bits with a selected code resulting in an encoded block of length P=S+R, where R denotes the number of redundant bits.

One of ordinary skill in the art would understand that although the embodiments are explained in terms of a layering model, this is for pedagogical purposes, and the various illustrative logical blocks, modules, circuits, and algorithm steps described in connection with the physical layer can be implemented as electronic hardware, computer software, or combinations of both. Thus, for example, the inner encoder 304 may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Figure 4:
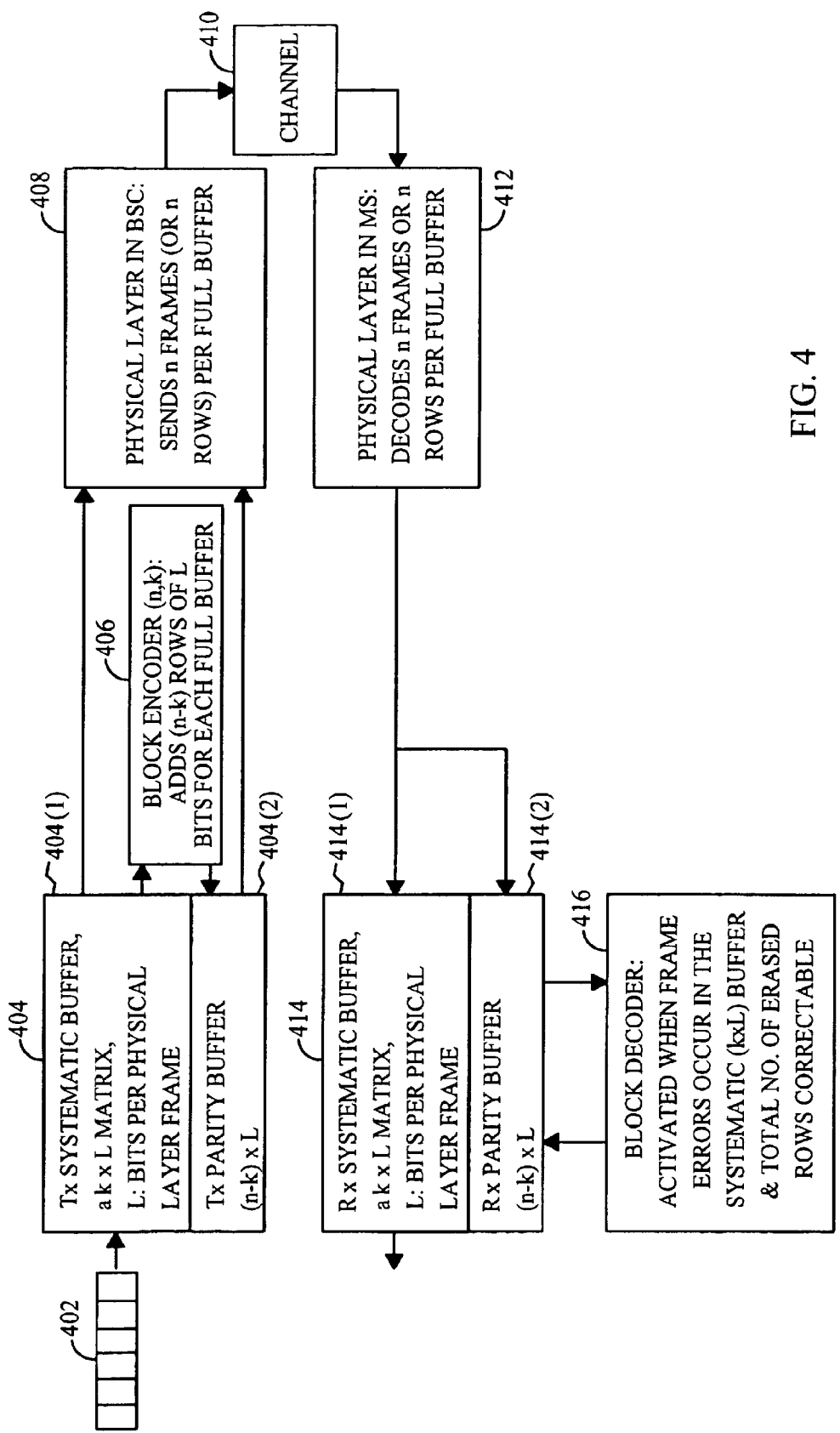
FIG. 4 illustrates physical layer processing in accordance with an embodiment.
Figure 5:
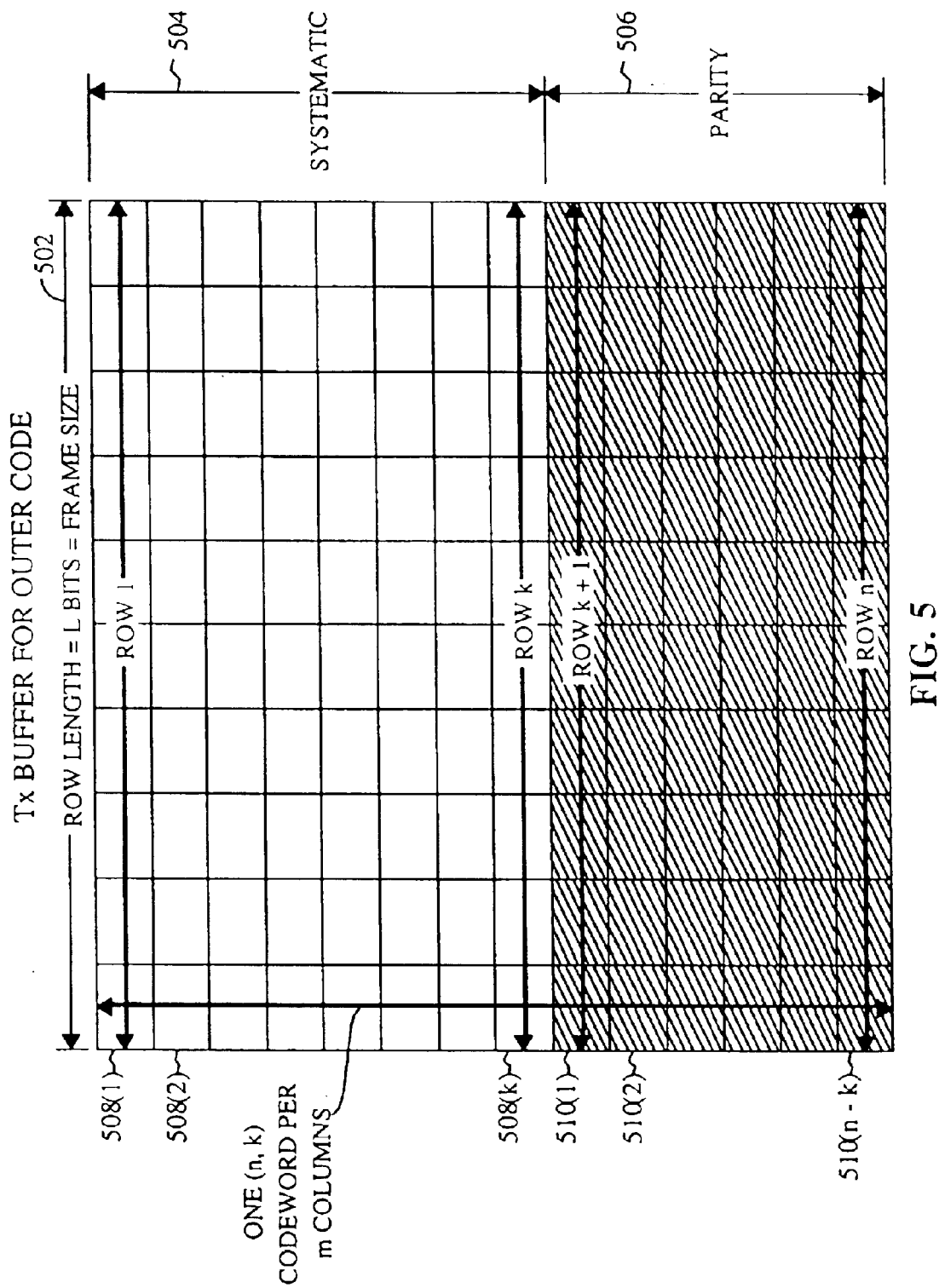
FIG. 5 illustrates a transmit buffer for an outer code in accordance with an embodiment.

In accordance with an embodiment, as illustrated in FIG. 4, the bit stream of information to be transmitted 402 is first encoded by an outer encoder 406 and the encoded stream is then provided to an inner encoder (not shown), residing within the physical layer 408. The bit stream of information to be transmitted 402, originating at higher layers, is provided to a transmit buffer 404. The transmit buffer is illustrated in more detail in FIG. 5. Referring to FIG. 5, the bits fill the systematic portion 504 of the transmit buffer 404 (of FIG. 4) row by row from left to right. The systematic portion 504 comprises k rows 508 of length L. In one embodiment, as shown in FIG. 5, the length L of the buffer coincides with the length of a radio frame without the overhead (e.g., CRC to help the inner decoder and the tail bits for the inner encoder). Referring back to FIG. 4, once the systematic portion 504 (of FIG. 5) is full, the outer block encoder 406 is activated to perform column-wise encoding of the bits in the systematic portion 504 (of FIG. 5) to generate (n-k) additional rows 510 (of FIG. 5) of parity bits. This column-wise operation is performed column by column for binary outer code, i.e., m=1 where m is a dimension of the code. For non-binary code, i.e., m>1, every m adjacent columns in a row are treated as an m-bit symbol. The m-bit symbols along the top k rows are read by the outer encoder to produce n-k m-bit symbols that fill the corresponding lower n-k rows of these columns.

In another embodiment, the length L of the buffer is equal to the number of bits the inner coded frames carries divided by m, the dimension of the outer encoder code. In this embodiment, the first m rows from the TX buffer are sent in the first inner coded frame, the second m rows of bits are sent in the second inner-coded frame, until the entire buffer is transmitted. Referring back to FIG. 4, once the systematic portion 504 (of FIG. 5) is full, the outer block encoder 406 is activated to perform column-wise encoding of the bits in the systematic portion 504 (of FIG. 5) to generate m(n-k) additional rows 510 (of FIG. 5) of parity bits. This column-wise operation is performed column by column for binary outer code, i.e., m=1. For non-binary code, i.e., m>1, every m rows of a column form an m-bit symbol. The k symbols from the top k m-rows in the column are read by the outer encoder to produce (n-k) m-bit symbols that fill the corresponding lower m(n-k) rows of the column.

In one embodiment the outer encoder comprises a systematic Reed-Solomon (R-S). The content of the transmit buffer 404 is then provided to a physical layer 408. On the physical layer 408, the individual frames are encoded by an inner encoder (not shown), which results in encoded frames. The structure of the inner decoder may be, e.g., the structure of FIG. 3. The systematic rows and the parity rows of the buffer may be interlaced during transmission to reduce the chance of large number of systematic rows erased when the total number of inner code erasure exceeds the outer code's correcting capability. The frames are further processed in accordance with a selected modulation scheme. In one embodiment, the processing is performed in accordance with the IS-2000 standard. The processed frames are then transmitted over a communication channel 410.

The transmitted frames are received at the destination station and provided to a physical layer 412. On the physical layer 412, the individual frames are demodulated and provided to an inner decoder (not shown). In one embodiment, the inner decoder decodes each frame, and if the decoding is successful, outputs a correctly decoded frame; or if the decoding is unsuccessful, declares an erasure. The success or failure of decoding must be determined with a high accuracy. In one embodiment, this is achieved by including a long (for example, 16-bit) cyclic redundancy check (CRC) in the frame after outer encoding and before inner encoding. However, one of ordinary skill in the art recognizes that other mechanisms for frame quality indication may be used. The included CRC obtained from the decoded frame is compared with a CRC calculated from the bits of the decoded frame, and if the two CRCs are identical, the decoding is declared successful. Further processing at the physical layer proceeds in accordance with the result of the inner decoder decision.

The correctly decoded frames are provided to the appropriate rows of a receive buffer 414. If all the systematic k frames are correctly decoded by the inner decoder, the systematic frames from the systematic portion 414(1) of the receive buffer 414 are passed to upper layer (not shown) for further processing without outer decoding.

If the inner decoder cannot decode the frame, the decoder declares an erasure, and provides an outer block decoder 416 with an indication that the frame is missing. The process continues until there are as many parity frames received correctly and passed to a parity portion 414(2) of a receive buffer 414, as there are erased systematic frames. The receiver stops the reception of any remaining frames and the outer decoder (not shown) is activated to recover the erased systematic frames. The recovered systematic frames are passed to the upper layer.

If the total number of correctly received frames in the receive buffer 414 is less than k, in accordance with one embodiment the outer decoder is not activated since there is no guarantee that the decoding would be successful. The correctly received systematic frames together with identification of the missing bits are passed to the higher layers. In another embodiment, the receiver uses decoded bits from the inner decoder (which are unreliable as indicated by the failed CRC checks) to recover bits for the systematic bits. In accordance with one embodiment, the receiver decodes the unreliable bits from the inner decoder and finds the most likely codeword. In another embodiment, the receiver uses measurement of the signal quality of the erased frames in the buffer to choose enough erroneously received frames with the highest signal to noise ratio to form a sub buffer with k rows. The receiver then performs bit flipping (changing a bit value of 0 to a bit value 1 and vice versa at one column at a time) and checks whether the bit flipping resulted in a codeword. In one embodiment, the bit flipping is first performed on the least reliable bits and continues with bits in the order of the bits' increasing reliability. The reliability of a bit may be determined in accordance with inner decoding metrics, e.g., a signal to noise and interference ratio during the frame, like the Yamamoto metric, the re-encoded symbol error rate, re-encoded energy metric, and other metrics known to one of ordinary skills in the art, or the metrics' combinations. If a codeword was not found, the bit flipping continues through all the remaining columns for all the unreliable rows. If a codeword was not found, the bit flipping continues with increased number of bits flipped (that is, changing 2 bits at a time, then 3 bits, until the maximum number of bits), until either a codeword is found or all combinations are exhausted. In another embodiment, the CRC from the unreliable rows are used to check the overall success of the decoding in this situation. The frames are passed to the higher layers only if the CRC from all rows match; otherwise, only bits from reliable rows are passed to the higher layers.

To improve reliability of decoding, in another embodiment, the demodulation and inner decoding are performed for more than k correctly received frames in a buffer. In accordance in yet another embodiment the demodulation and inner decoding are performed for all frames in the buffer. In both embodiments, the outer decoding is performed on the k (or km) rows with the highest quality. The quality may be determined in accordance with inner decoding metrics, e.g., a signal to noise and interference ratio during the frame, like the Yamamoto metric, the re-encoded symbol error rate, re-encoded energy metric, and other metrics known to one of ordinary skills in the art, or the metrics' combinations. Use of quality metrics for quality estimation is disclosed in detail in U.S. Pat. No. 5,751,725 entitled "METHOD AND APPARATUS FOR DETERMINING THE RATE OF RECEIVED DATA IN A VARIABLE RATE COMMUNICATIONS SYSTEM" and U.S. Pat. No. 5,774,496 entitled "METHOD AND APPARATUS FOR DETERMINING DATA RATE OF TRANSMITTED VARIABLE RATE DATA IN A COMMUNICATIONS RECEIVER" and both are assigned to the assignee of the present invention.

Even in a broadcast communication system utilizing an outer code and inner code, a subscriber station may not be able to create the bit stream of information from decoded received packets from a particular base station.

Figure 6:
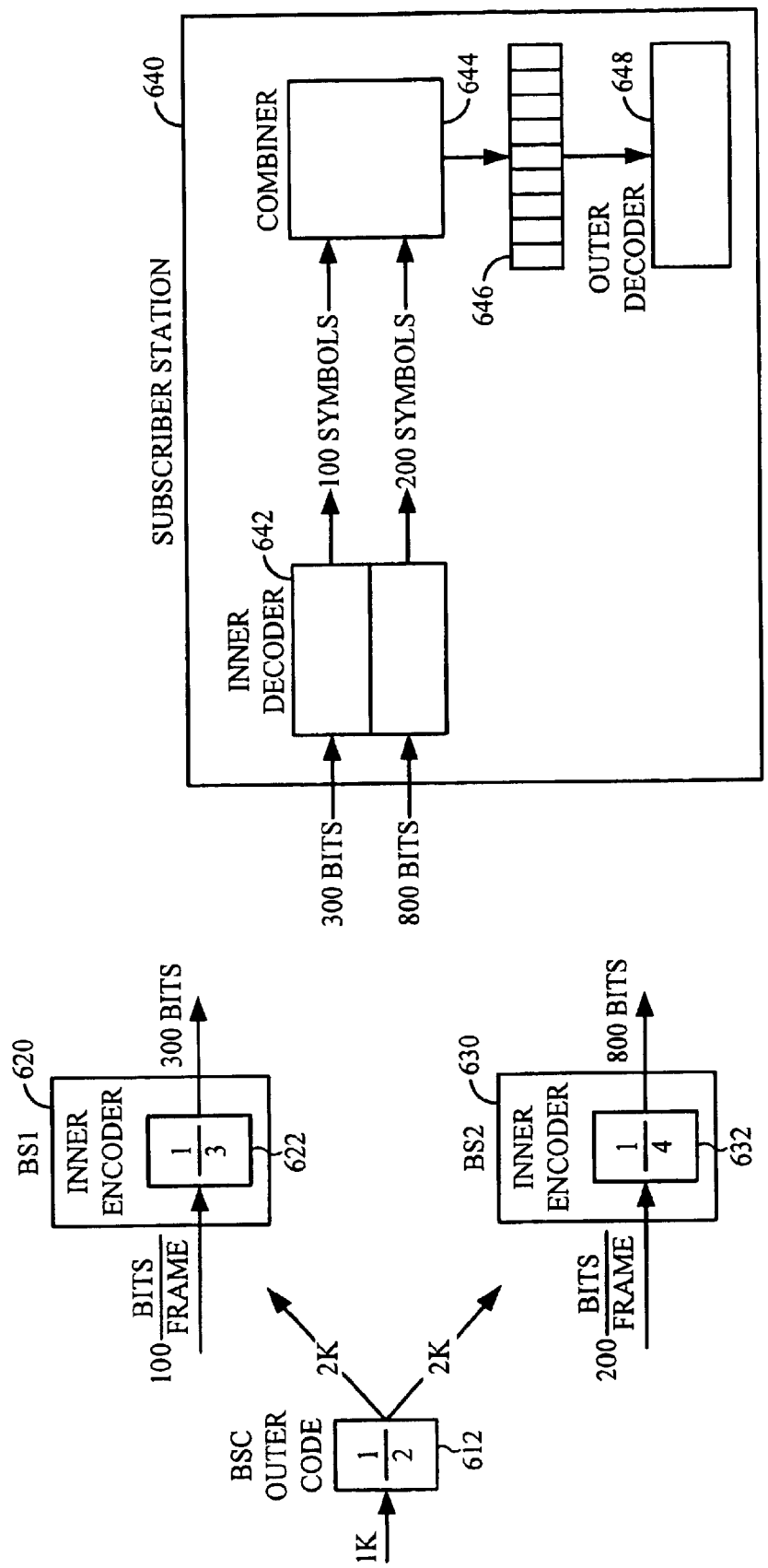
FIG. 6 shows a block diagram of an outer encoder, inner encoders, inner decoder, and outer decoder in accordance with an embodiment.

FIG. 6 shows a block diagram of an outer encoder 612 of a base station controller 610, inner encoders 622, 632 of base stations 620, 630, respectively, inner decoder 642 of subscriber station 640, and outer decoder 648 of subscriber station 640, in accordance with an embodiment. It would be understood by those skilled in the art that the outer encoder 612 may be located other than at a base station controller.

Given a 1 k bit stream of information is provided to an outer encoder 612 that is a ½ rate encoder, then 2 k bits are output from the outer encoder 612. In an embodiment, the 2 k bits are broadcast to base stations 620, 630. Given that an inner encoder 622 of a first base station (BS1) 620 operates on a frame size of 100 bits and is a ⅓ rate encoder, then for each frame of data 300 bits are output from the inner encoder 632. Given that an inner encoder 632 of a second base station (BS2) 630 operates on a frame size of 200 bits and is a ¼ rate encoder, then for each frame of data, 800 bits are output from the inner encoder 622. It would be understood by those skilled in the art that encoders and decoders of varying rates may be used in an embodiment.

An inner decoder 642 of a subscriber station 640 decodes the 300 bits from the first base station 620 and decodes the 800 bits from the second base station 630, and outputs 100 inner decoded symbols representing the bits from the first base station 620 and 200 inner decoded symbols representing the bits from the second base station 620. It would be understood by those skilled in the art that the symbols can be any kind of symbols known in the art. In an embodiment, the symbols are hard symbols known in the art. In another embodiment, the symbols are soft symbols known in the art. A hard symbol can take on the values of either 0 or 1. A soft symbol indicates the likelihood of the received signal towards 0 or 1 and usually takes on continuous values.

The subscriber station 640 includes a combiner 644 that combines inner decoded symbols from the first base station 620 and second base station 630 and places the combined symbols into an outer decoder buffer 646. It would be understood by those skilled in the art that the combiner 644 could be located within the inner decoder 642 or the outer decoder 648. It would also be understood by those skilled in the art that the combiner 644 could employ any combining scheme known in the art that increases the reliability of the corresponding bits by combining symbols.

The inner decoded symbols from the first base station 620 and the second base station 630 are combined according to their corresponding location in the 2 k bit stream of information originally at the output of the outer encoder 612. For example, the first 100 symbols representing the bits from the first base station 620 corresponds to the first 100 bits of the 2 k bit stream of information originally at the output of the outer encoder 612. Likewise, the first 200 bits representing the bits from the second base station 630 corresponds to the first 200 symbols of the 2 k bit stream of information originally at the output of the outer encoder 612. Thus, the first 100 symbols representing the bits from the first base station 620 is combined by combiner 644 with the first 100 symbols of the aforementioned 200 symbols representing the bits from the second base station 630. Then, the combiner 644 places the combined 100 symbols at the front of the outer decoder buffer 646.

In an embodiment, a block of information is encoded at a control center such as a BSC. The encoded symbols are then distributed to multiple base stations. Each base station then can transmit part or all of the encoded symbols.

In an embodiment, a BSC distributes all encoded symbols to each base station. Each base station then decides whether it is going to transmit all or part of the symbols based on its available communication resources (power, Walsh code, time duration), modulates the selected symbols and transmit them. In this case, there is no collaboration among base stations.

In another embodiment, each base station periodically reports its available communication resources (power, Walsh code, time duration) to a BSC. The BSC then decides which base station is to transmit what part of the encoded symbols. The BSC operates to reduce the overlap of portions that are to be transmitted by different base stations and to reduce the occurrence of the same encoded symbols transmitted by multiple base stations. Thus, there is some collaboration among base stations. As a result of the collaboration, the effective code rate can be reduced.

In an embodiment, at the receiver, the subscriber station figures out how to combine the symbols received from different base stations. From the information in the F-PDCCH associated with the F-PDCH, the subscriber station can figure out how many binary symbols were transmitted from each base station. However, additional information is still needed in order to combine the symbols from the different base stations.

In an embodiment, a rule indicating which base stations transmit which symbols is defined apriori. In one embodiment, each base station has a default starting point within a bit stream to transmit symbols and the default starting points are known to the subscriber station. In another embodiment, a first base station always starts from the beginning of the bit stream to transmit symbols, and a second base station always starts from the end of the bit stream and works backward through the bit stream.

In an embodiment, explicit signaling is used. Each base station signals to the subscriber station what symbols are being transmitted from the base station. The signaling can be a specification of the range of the selected symbols. It would be apparent to those skilled in the art that there are other means for signaling to the subscriber station an indication of what symbols are being transmitted from each base station.

Figure 7:
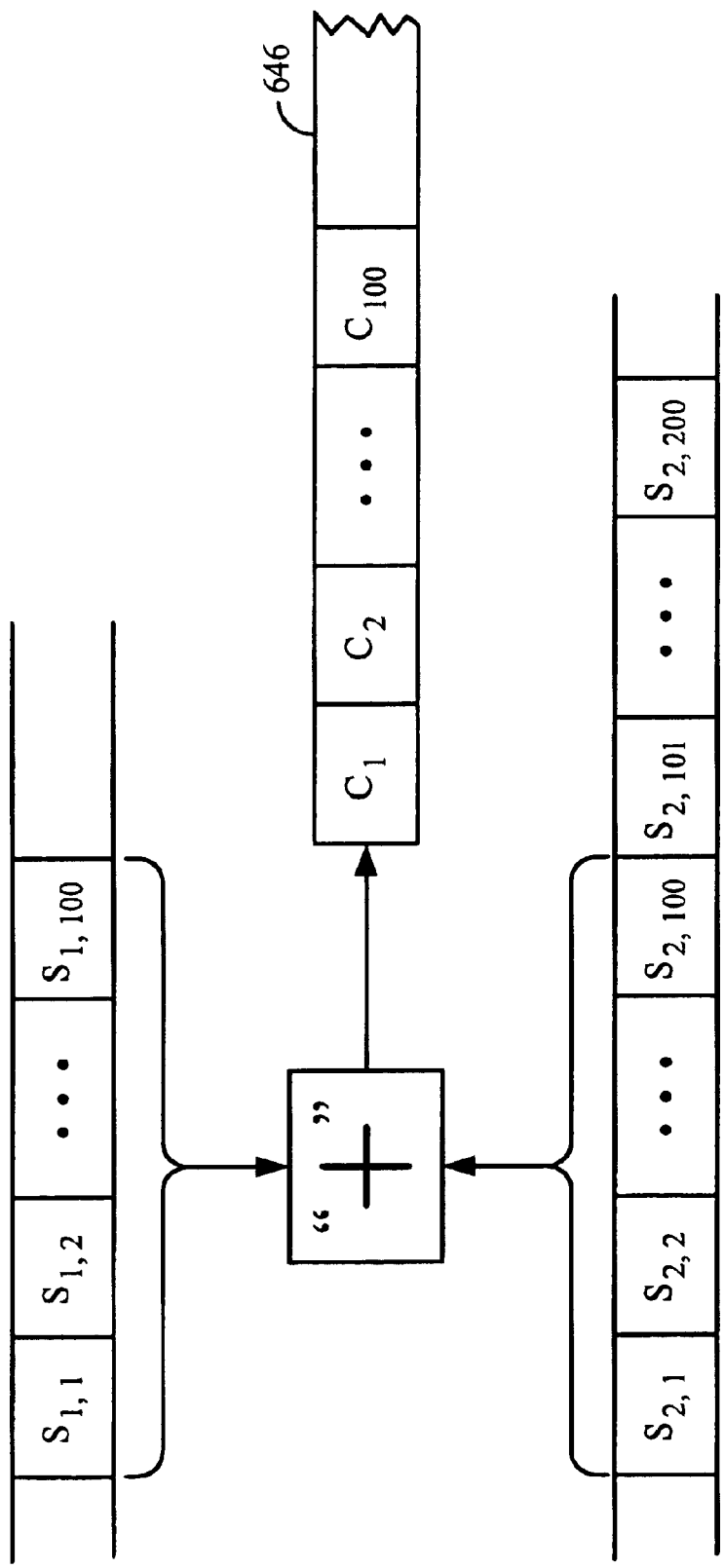
FIG. 7 shows a representation of the process of combining of an embodiment as applied to an example, wherein only the combining of first 100 symbols is shown.

FIG. 7 shows a representation of the process of combining, wherein only the combining of first 100 symbols is shown. The 100 symbols representing the bits from the first base station 620 are combined with the 100 symbols of the aforementioned 200 symbols representing the bits from the second base station 630, and the combined result is placed into outer decoder buffer 646. The 100 symbols representing the bits from the first base station 620 are denoted by S1, i, the 100 symbols of the aforementioned 200 symbols representing the bits from the second base station 630 are denoted by S2, i, and the combined result that is placed into the outer decoder buffer 646 is denoted by Ci, where i=1, 2, . . . , 100. The "+" operator is defined as a combine function.

The combiner 644 executes a combining operation that includes a validating operation. The validating operation validates each bit of data. The validating operation determines whether a particular bit of data has been inner decoded with no errors. If the particular bit of data has been inner decoded with no errors, then that bit is valid for combining.

When hard symbols are combined, they can be combined based on majority voting. In one embodiment, a hard symbol is received from a base station but no symbol is received from other base stations that corresponds to the same bit, the hard symbol received from the first mentioned base station is used in outer decoding. In another embodiments, hard symbols are received from several base stations that correspond to the same bit, the majority voting of the received hard symbols is used in outer decoding.

When soft symbols are combined, they can be combined to improve the overall likelihood. In one embodiment, the combining approach is to sum up the logarithmic likelihood.

Once the symbols are combined and placed into the outer decoder buffer 646, the outer decoder 648 decodes the combined symbols and the decoded result can be used by the subscriber station 640.

If all outer encoded bits are sent to all base stations and all base stations transmit all outer encoded bits, then the combiner 644 has selection diversity. Selection diversity means that the combiner can select symbols that are derived from diverse, i.e., different base stations, and place them into the outer decoder buffer.

If all outer encoded bits are sent to all base stations, but different base stations transmit different portions of the outer encoded bits, then the combiner not only has selection diversity (if a bit is transmitted from more than one base stations, that is, different base stations transmit different portions of the outer encoded bits with overlapping), but also code combining gain (code rate reduction and thus lower SNR requirement).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

What is claimed is:

1. A method of combining, comprising:

outer encoding a set of bits;

distributing a first subset of the outer encoded bits to a first station;

distributing a second subset of the outer encoded bits to a second station;

inner encoding the first subset of outer encoded bits, thereby creating a first subset of inner encoded bits;

inner encoding the second subset of outer encoded bits, thereby creating a second subset of inner encoded bits;

modulating the first subset of inner encoded bits, the modulating creating a modulated first subset of inner encoded bits;

modulating the second subset of inner encoded bits, the modulating creating a modulated second subset of inner encoded bits;

transmitting the modulated first subset of inner encoded bits to a third station;

transmitting the modulated second subset of inner encoded bits to the third station;

demodulating the modulated first subset of inner encoded bits, the demodulating creating a demodulated first subset of bits;

demodulating the modulated second subset of inner encoded bits, the demodulating creating a demodulated second subset of bits;

inner decoding the demodulated first subset of bits;

inner decoding the demodulated second subset of bits; and combining the inner decoded first subset of bits with the inner decoded second subset of bits, thereby creating a combined set of bits.

2. The method of claim 1, further comprising outer decoding the combined set of bits.

3. The method of claim 1, wherein the first station and the second station are base stations.

4. The method of claim 1, wherein the third station is a subscriber station.

5. The method of claim 1, wherein the combining is performed based on an apriori rule indicating the first subset of bits and the second subset of bits.

6. The method of claim 1, wherein the combining is performed based on an signaling from the first station and the second station to the third station, the signaling from the first station indicating the first subset of bits and the signaling from the second station indicating the second subset of bits.

7. The method of claim 1, wherein the first station transmits the modulated first subset of inner encoded bits to a third station based on a communication resource.

8. The method of claim 7, wherein the communication resource is power.

9. The method of claim 7, wherein the communication resource is a number of Walsh codes available for transmission.

10. The method of claim 7, wherein the communication resource is transmission time availability.

11. The method of claim 1, further comprising determining the first subset of bits and the second subset of bits based on the available communication resources of the first station and the available communication resources of the second station.

12. The method of claim 11, further comprising reporting available communication resources of the first station and the second station to a fourth station, wherein the fourth station determines the first subset of bits and the second subset of bits.

13. The method of claim 11, wherein the transmitting is on a forward data packet channel.

14. The method of claim 13, wherein the third station determines how many bits were transmitted from the first station based on information on a forward data packet control channel from the first station and determines how many bits were transmitted from the second station based on information on a forward data packet control channel from the second station.

* * * * *